US011158620B2

(12) United States Patent
Herner et al.

(10) Patent No.: US 11,158,620 B2
(45) Date of Patent: Oct. 26, 2021

(54) WAFER BONDING IN FABRICATION OF 3-DIMENSIONAL NOR MEMORY CIRCUITS

(71) Applicant: SUNRISE MEMORY CORPORATION, Fremont, CA (US)

(72) Inventors: Scott Brad Herner, Lafayette, CO (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 16/579,329

(22) Filed: Sep. 23, 2019

(65) Prior Publication Data
US 2020/0098738 A1    Mar. 26, 2020

Related U.S. Application Data

(60) Provisional application No. 62/735,678, filed on Sep. 24, 2018.

(51) Int. Cl.
H01L 29/40    (2006.01)
H01L 25/18    (2006.01)
H01L 25/065    (2006.01)

(52) U.S. Cl.
CPC .......... *H01L 25/18* (2013.01); *H01L 25/0657* (2013.01); *H01L 2225/06524* (2013.01)

(58) Field of Classification Search
None
See application file for complete search history.

(56) References Cited

U.S. PATENT DOCUMENTS

| 4,213,139 | A  | 7/1980  | Rao |
| 5,915,167 | A  | 6/1999  | Leedy |
| 6,434,053 | B1 | 8/2002  | Fujiwara |
| 6,774,458 | B2 | 8/2004  | Fricke et al. |
| 6,946,703 | B2 | 9/2005  | Ryu et al. |
| 7,005,350 | B2 | 2/2006  | Walker et al. |
| 7,307,308 | B2 | 12/2007 | Lee |
| 8,178,396 | B2 | 5/2012  | Sinha et al. |
| 8,630,114 | B2 | 1/2014  | Lue |
| 8,767,473 | B2 | 7/2014  | Shim et al. |
| 8,848,425 | B2 | 9/2014  | Schloss |
| 8,878,278 | B2 | 11/2014 | Alsmeier et al. |
| 9,799,761 | B2 | 10/2017 | Or-Bach et al. |

(Continued)

FOREIGN PATENT DOCUMENTS

WO    2018236937 A1    12/2018

OTHER PUBLICATIONS

"PCT Search Report and Written Opinion, PCT/US2020/015710", dated Jun. 9, 2020.

(Continued)

*Primary Examiner* — Ali Naraghi
(74) *Attorney, Agent, or Firm* — Edward C. Kwok; VLP Law Group, LLP

(57) ABSTRACT

A memory array and single-crystal circuitry are provided by wafer bonding (e.g., adhesive wafer bonding or anodic wafer bonding) in the same integrated circuit and interconnected by conductors of an interconnect layer. Additional circuitry or memory arrays may be provided by additional wafer bonds and electrically connected by interconnect layers at the wafer bonding interface. The memory array may include storage or memory transistors having single-crystal epitaxial silicon channel material.

11 Claims, 12 Drawing Sheets

(56) References Cited

U.S. PATENT DOCUMENTS

| | | |
|---|---|---|
| 9,842,651 B2 | 12/2017 | Harari |
| 9,911,497 B1 | 3/2018 | Harari |
| 10,096,364 B2 | 10/2018 | Harari |
| 10,249,370 B2 | 4/2019 | Harari |
| 10,283,493 B1 * | 5/2019 | Nishida ............. H01L 27/11582 |
| 10,381,370 B2 * | 8/2019 | Shin .................. H01L 27/11556 |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,622,377 B2 | 4/2020 | Harari et al. |
| 10,651,153 B2 * | 5/2020 | Fastow ............... H01L 25/0652 |
| 2001/0053092 A1 | 12/2001 | Kosaka et al. |
| 2002/0193484 A1 | 12/2002 | Albee |
| 2004/0214387 A1 | 10/2004 | Madurawe et al. |
| 2004/0246807 A1 | 12/2004 | Lee |
| 2004/0262772 A1 * | 12/2004 | Ramanathan ........... H01L 24/81 257/777 |
| 2005/0128815 A1 | 6/2005 | Ishikawa et al. |
| 2006/0155921 A1 | 7/2006 | Gorobets et al. |
| 2009/0157946 A1 | 6/2009 | Arya |
| 2009/0279360 A1 | 11/2009 | Peter et al. |
| 2010/0124116 A1 | 5/2010 | Takashi et al. |
| 2011/0208905 A1 | 8/2011 | Shaeffer et al. |
| 2011/0298013 A1 | 12/2011 | Hwang et al. |
| 2012/0243314 A1 | 9/2012 | Takashi |
| 2015/0155876 A1 | 6/2015 | Jayasena et al. |
| 2016/0086970 A1 | 3/2016 | Peng |
| 2016/0314042 A1 | 10/2016 | Plants |
| 2017/0092370 A1 | 3/2017 | Harari |
| 2018/0108416 A1 | 4/2018 | Harari |
| 2018/0331042 A1 | 11/2018 | Manusharow et al. |
| 2018/0366471 A1 | 12/2018 | Harari et al. |
| 2018/0366489 A1 | 12/2018 | Harari et al. |
| 2019/0006009 A1 | 1/2019 | Harari |
| 2019/0180821 A1 | 6/2019 | Harari |
| 2019/0206890 A1 | 7/2019 | Harari et al. |
| 2019/0244971 A1 | 8/2019 | Harari |
| 2019/0325964 A1 | 10/2019 | Harari |
| 2019/0319044 A1 | 11/2019 | Harari |
| 2019/0355747 A1 | 11/2019 | Herner et al. |
| 2020/0051990 A1 | 2/2020 | Harari et al. |
| 2020/0098779 A1 | 3/2020 | Cernea et al. |
| 2020/0176468 A1 | 6/2020 | Herner et al. |

OTHER PUBLICATIONS

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

"PCT Search Report and Written Opinion, PCT/US2018/038373", dated Sep. 10, 2018.

"PCT Search Report and Written Opinion, PCT/US2019/052446", dated Dec. 11, 2019.

"Invitation to Pay Additional Fees (PCT/ISA/206), PCT/US2020/015710", dated Mar. 20, 2020, 2 pages.

* cited by examiner

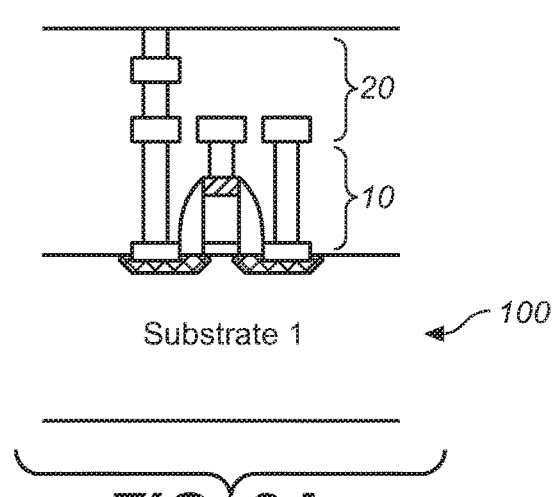
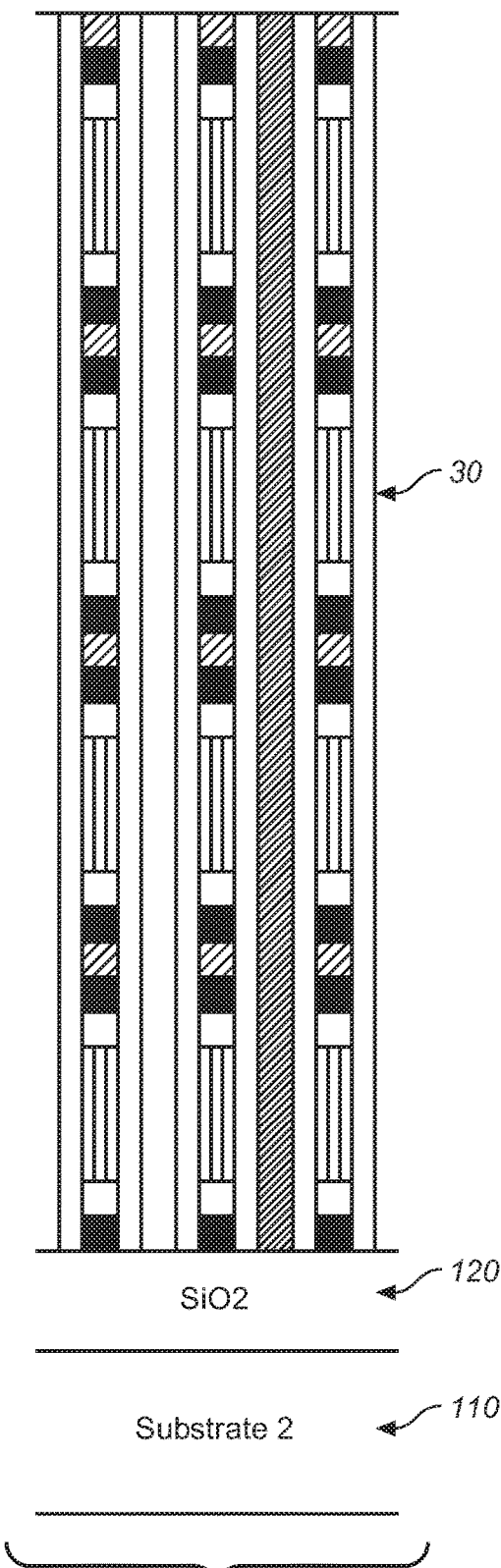
FIG. 2A
FIG. 2B

WAFER BONDING IN FABRICATION OF 3-DIMENSIONAL NOR MEMORY CIRCUITS

CROSS REFERENCE TO RELATED APPLICATIONS

The present application is related to and claims priority of U.S. provisional patent application ("Provisional Application I"), Ser. No. 62/735,678, entitled "Wafer Bonding in Fabrication of 3-Dimensional NOR Memory Circuits," filed on Sep. 24, 2018.

The present application is also related to U.S. patent application, Ser. No. 16/012,731, entitled "3-Dimensional NOR Memory Array Architecture and Methods for Fabrication Thereof," filed Jun. 19, 2018. The present application is also related to U.S. provisional patent application ("Provisional Application II"), Ser. No. 62/735,662, entitled "Epitaxial Monocrystalline Channel for Storage Transistors in 3-Dimensional Memory Structures and Methods for Formation Thereof," filed on the same day as the present application. The disclosures of the Application and the Provisional Applications I and II are hereby incorporated by reference in their entireties.

BACKGROUND OF THE INVENTION

1. Field of the Invention

The present invention relates to wafer bonding techniques in integrated circuit manufacturing. In particular, the present invention relates to wafer bonding techniques applied to high-density 3-dimensional memory circuits.

2. Discussion of the Related Art

Wafer bonding is a technique used in the manufacturing of many semiconductor devices. In wafer bonding, two wafers of near-equal area or equal areas are joined, for example, by thermocompression, adhesive, anodic, or thermal techniques. Often, all or substantially all of the substrate in one or both wafers are removed after bonding.

The Copending Application discloses 3-dimensional memory structures, formed on top of a monocrystalline semiconductor substrates, that are organized as arrays of NOR memory strings. In this context, the term "NOR memory string" refers to a group of thin-film storage transistors sharing common source and drain regions. FIG. 1 illustrates, in cross section, memory structure 30, including an array of NOR memory strings, being formed on top of CMOS circuitry and interconnect layers on a semiconductor substrate. As shown in FIG. 1, memory structure 30 is formed on substrate 150. A suitable substrate may be, for example, a semiconductor wafer that is used for fabrication of electronic circuits, as known to those of ordinary skill in the art. Non semiconductor substrates, such as SiO2, may also be used.

Semiconductor substrate 150 may have fabricated thereon and therein various circuit elements (e.g., CMOS circuitry 10 represented by CMOS transistor in FIG. 1) interconnected by conductors 22 (e.g., copper) in conventional interconnect layers through contacts or vias 16. These circuit elements are first fabricated on the semiconductor substrate using conventional techniques before forming memory structure 30. The interconnect layers (referred herein collectively as "interconnect layers 20") are typically embedded in a dielectric layer and may include conductors intended for supporting operations of memory arrays in memory structure 30, which is to be formed over interconnect layers 20. For example, interconnect layer 24 provides conductors ("global word lines 24") that are intended to connect conductors 32 (e.g., heavily-doped polysilicon) serving as word lines that address storage transistors in memory structure 30. Conductors 32 are referred to as "local word lines" in this detailed description.

As shown in FIG. 1, memory structure 30 includes numerous stacks of "active strips" (e.g., active stacks 101a, 101b and 101c). For example, FIG. 1 shows stacks 101a, 101b and 101c each including 4 active strips isolated from each other by isolation layers 107. FIG. 1 is a cross section through the active strips, which extend lengthwise into and out of the plane of cross section. In this context, an active strip includes drain layer 104, source layer 103, body layer 102, and channel layers 108. (Channel layers 108 are provided on both sides of body layer 102.) In some implementations, drain layer 104 and source layer 103 are both $n^+$ polysilicon, channel layers 108 are each $p^-$ polysilicon and body layer 102 is a $p^+$ polysilicon. In some implementations, rather than body layer 102, a dielectric layer may be used. Also shown in the active strips of FIG. 1 are conductive layers 105t and 105b, adjacent respectively to source layer 103 and drain layer 104, for reducing resistivity along the lengths of source layer 103 and drain layer 104. Along each side of each stack of active strips (and, hence, along each side of each active strip) is provided a charge-trapping layer 107 and numerous local word lines 32. In FIG. 1, local words line 32 are conductive columns arranged along both sides of a stack of active strips. A storage transistor is constituted by a local word line, a portion of channel layer 108, the portion of charge-trapping layer 107 therebetween, and source and drain layers 103 and 104. Drain layer 104 and source layer 103 are shared by the numerous storage transistors formed along an active strip. Adjacent storage transistors along an active strip sharing common source and drain layers form a NOR memory string. (Turning on any storage transistor in the NOR memory string results in a conducting transistor current between the common source and drain layers.)

This sequence of fabrication steps imposes constraints on the CMOS devices, the interconnect layers, and the memory devices. For example, the memory devices typically require a thermal budget of at least 750° C. for several hours during fabrication, due to needs in the deposition of the oxide-nitride-oxide (ONO) multi-layer or stack using low pressure chemical vapor deposition (LPCVD). In the ONO multi-layer, desirable oxide and nitride may be, respectively, high-temperature oxide ("HTO"; or $SiO_2$) and silicon nitride (SiN). Furthermore, a layer of aluminum oxide ($Al_2O_3$) is often preferred as a blocking oxide in the ONO stack. However, crystallizing $Al_2O_3$—which produces a desired $Al_2O_3$, from the electrical characteristics viewpoint—requires an anneal temperature of 900° C. or greater. However, a fabrication temperature exceeding 350° C. would exclude the use of copper in horizontal interconnect layers 20 embedded in associated low-κ dielectric films, even when tungsten is used in vertical interconnects 16 to connect the copper horizontal interconnects. Likewise, a fabrication temperature exceeding 500° C. would exclude the use of aluminum interconnects. One candidate for interconnect material for a fabrication temperature exceeding 500° C. is tungsten. However, tungsten has a higher resistivity, as shown in Table 1 below. The resulting increase in interconnect resistance increases signal delays, which adversely impact memory device performance.

| material | Thin-film resistivity (μΩ-cm) |
| --- | --- |
| copper | 1.7-2.0 |
| aluminum | 2.7-3.0 |
| tungsten | 8-15 |

With respect to the underlying CMOS circuitry (e.g., CMOS transistors 10), the thermal budget for the memory devices impose constraints in at least two ways. First, cobalt silicide or other high temperature contact material such as tungsten or tungsten silicide would have to be selected as the gate and source/drain metallization 12 in CMOS transistor 10, so as to allow a maximum fabrication temperature of 750° C. While cobalt silicide has relatively low sheet and contact resistances, as compared to silicon, the relatively large consumption of underlying silicon during the silicidation step and the roughness of the resulting cobalt silicide-silicon interface require relatively deep dopant junctions in the silicon. On the other hand, shallow dopant junctions are required in short-channel length transistors to reduce leakage currents. Although nickel silicide is often used in source and drain contacts of the current generation of small transistors, cobalt silicide is preferred over nickel silicide as nickel silicide cannot withstand a temperature greater than 450° C. At a temperature greater than 450° C., a nickel silicide film would agglomerate on the silicon, which would destroy the low-sheet resistance and low-contact resistance character of the nickel silicide film.

Second, for shallow junctions and narrow channel devices, temperatures above 600° C. are to be avoided after junction formation to prevent dopant diffusion out of the source and drain junctions.

Therefore, a method of fabrication is desired that allows integrating optimal CMOS devices and interconnect layers with a 3-dimensional NOR memory structure (e.g., memory structure 30 of FIG. 1), without the thermal budget of the memory structure constraining design choices for the CMOS devices and the interconnect layers.

SUMMARY

According to one embodiment of the present invention, a memory array and single-crystal circuitry are provided by wafer bonding (e.g., adhesive wafer bonding or anodic wafer bonding) in the same integrated circuit and interconnected by conductors of a interconnect layer.

Additional circuitry or memory arrays may be provided by additional wafer bonds and electrically connected by interconnect layers at the wafer bonding interface.

According to one embodiment of the present invention, the memory array may include storage or memory transistors having single-crystal epitaxial silicon channel material.

The present invention is better understood upon consideration of the detailed description below, in conjunction with the accompanying drawings.

BRIEF DESCRIPTION OF THE DRAWINGS

FIG. 2A, shows semiconductor substrate 100 on which CMOS devices and interconnect layers for supporting a 3-dimensional NOR memory structure are fabricated.

FIG. 2B shows a 3-dimensional NOR memory structure (i.e., memory structure 30) is separately fabricated on semiconductor substrate 110 over an isolation oxide (e.g., $SiO_2$) layer 120.

For clarity of presentation and to allow cross referencing among the figures, like elements in the figures are assigned like reference numerals.

DETAILED DESCRIPTION OF THE PREFERRED EMBODIMENTS

Figure 1:
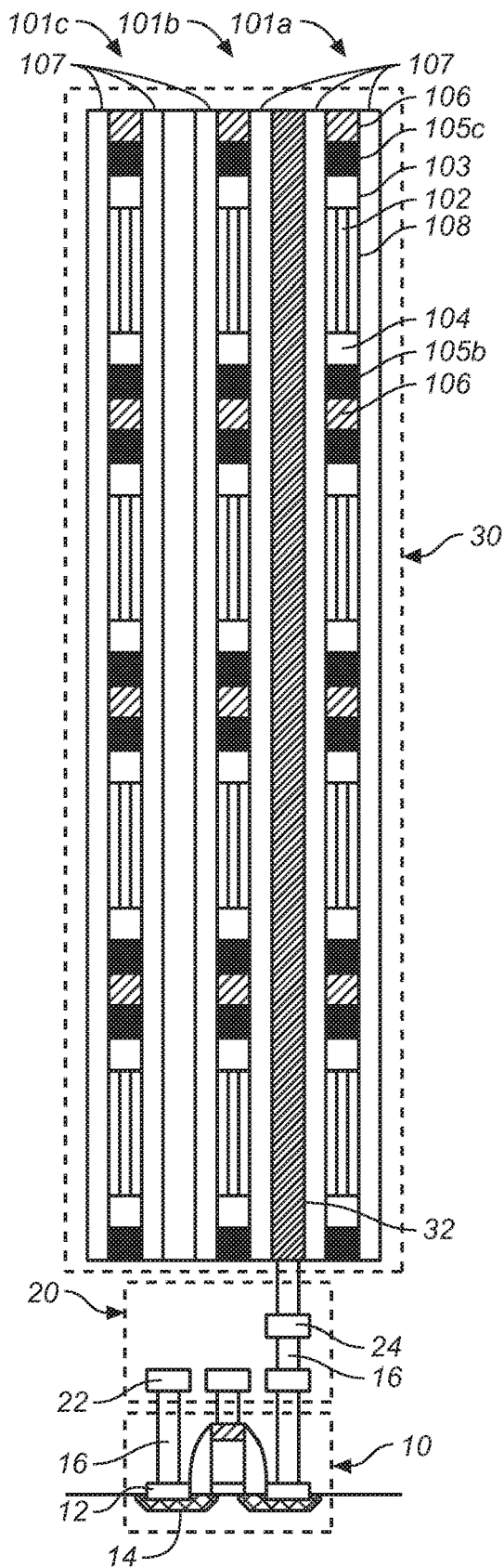
FIG. 1 illustrates, in cross section, memory structure 30, including an array of NOR memory strings, being formed on top of CMOS circuitry and interconnect layers on a semiconductor substrate.

According to one embodiment of the present invention, rather than fabricating the CMOS devices (e.g., CMOS transistor 10) and the interconnect layers (e.g., interconnect layers 20) on the same silicon substrate as memory structure 30, the CMOS devices and the interconnect layers are fabricated on a separate semiconductor substrate. FIG. 2A, shows semiconductor substrate 100 on which CMOS devices 10 and interconnect layers 20 for supporting a 3-dimensional NOR memory structure are fabricated. The 3-dimensional NOR memory structure (i.e., memory structure 30) is separately fabricated on substrate 110 over an isolation oxide (e.g., $SiO_2$) layer 120, as shown in FIG. 2B. Substrates 100 and 110 may both be provided by silicon wafers, as known to those of ordinary skill in the art.

After the required fabrication steps are carried out on each of semiconductor substrates 100 and 110, the wafers are bonded together, using a "flip chip" technique, in which the surface of semiconductor substrate 100 with the interconnect layers 20 is bonded to the surface of semiconductor substrate 110 with memory structure 30. In this manner, fabrication of interconnect layers 20 and CMOS devices 10 is not constrained by the elevated temperatures optimal to fabricating memory structure 30.

Figure 3A:
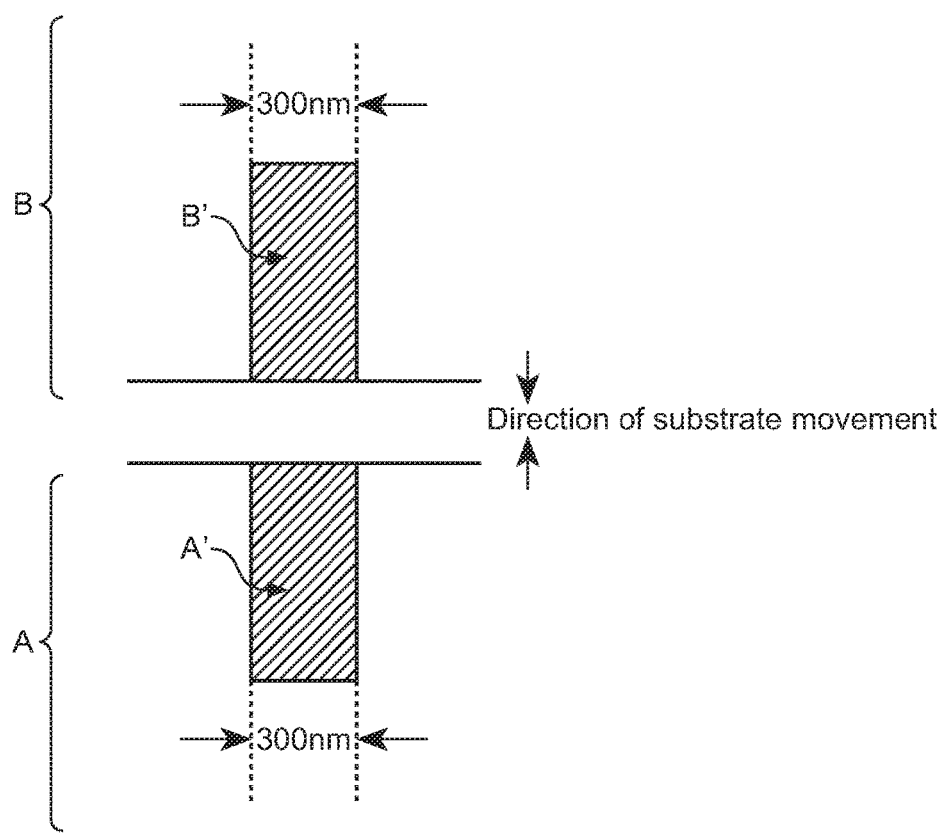
FIG. 3A shows two devices A' and B' fabricated on wafer substrates A and B to be wafer bonded.
Figure 3B:
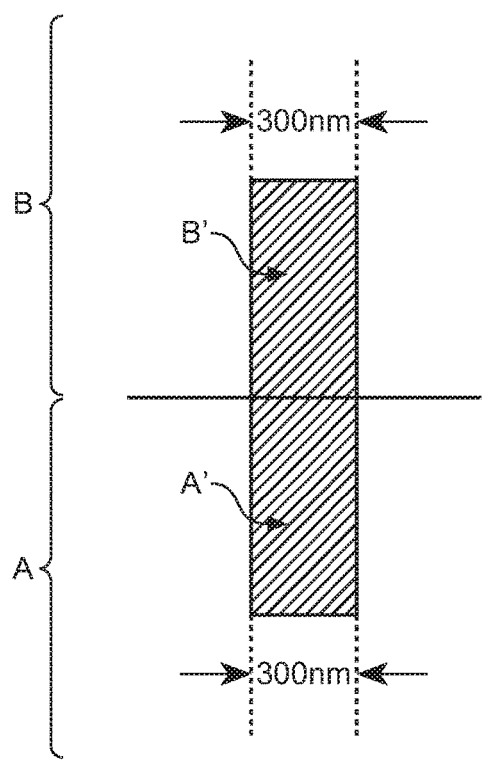
FIG. 3B shows devices A' and B' being perfectly aligned and electrically connected after wafer bonding.
Figure 3C:
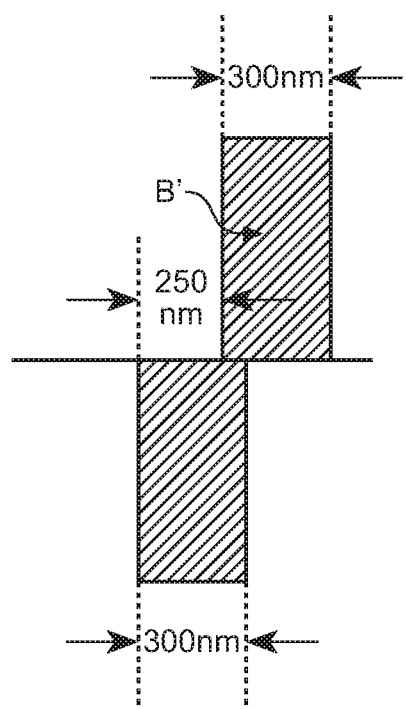
FIG. 3C shows devices A' and B' being electrically connected after wafer bonding, with a 250 nm-wide misalignment.

The wafers are bonded such that contact points in interconnect layers 20 are connected electrically to corresponding contact points of memory structure 30. Lithographic alignment marks in each respective substrate allow the target bonding points to be aligned with minimal mismatch. FIGS. 3A-3D illustrate exemplary wafer bonding of substrates A and B at designated wafer bonding points. FIG. 3A shows two devices A' and B' fabricated on wafer substrates A and B to be wafer bonded. Devices A' and B' may be, for example, 300 nm-wide conductors in an interconnect system. FIG. 3B shows devices A' and B' being perfectly aligned and electrically connected after wafer bonding. FIG. 3C shows devices A' and B' being electrically connected after wafer bonding, with an 250 nm-wide misalignment. (Alignment accuracy to within ±250 nm is achievable in state-of-the-art wafer bonding techniques). Bonding of substrates A and B may be carried out using any suitable wafer bonding technique, such as thermocompression, anodic, plasma-activated, eutectic, or surface-activated wafer bonding. Among these techniques, anodic wafer bonding is preferred. With anodic wafer bonding, two wafer substrates are brought into contact and an electrostatic field is applied, which causes the apparatus to be connected electrically and physically.

Figure 3D:
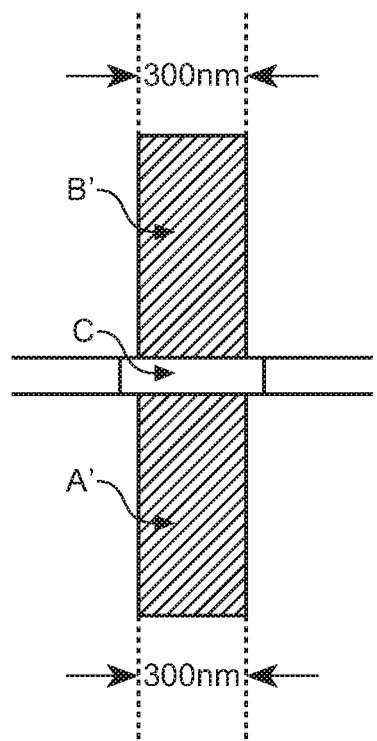
FIG. 3D shows using adhesive metal C to promote bonding between wafers A and B at devices A' and B' (i.e., the points of mutual contacts).

According to one embodiment of the present invention, as illustrated by FIG. 3D, adhesive metal C may be used to promote bonding between wafers A and B at the point of their mutual contacts (i.e., devices A' and B'). Adhesive metal C may be, for example, chromium, titanium, or indium, any of their alloys, or any suitable material. The principles and mechanisms of wafer bonding are known to those of ordinary skill in the art and are thus omitted in this detailed description.

Figure 4:
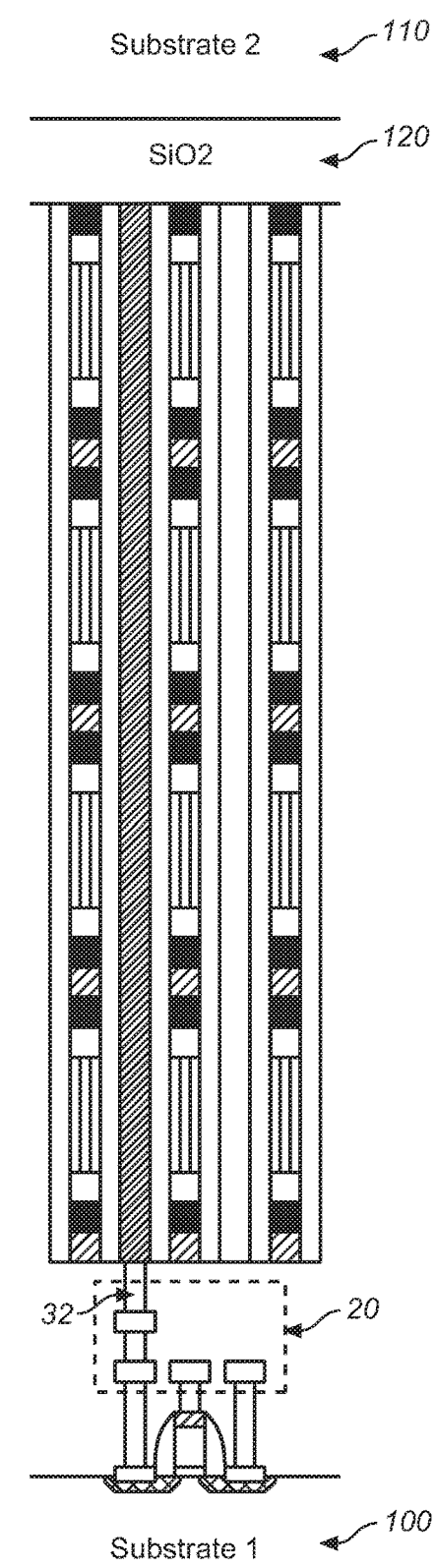
FIG. 4 shows, using as example the wafers of FIGS. 2A and 2B, memory structure 30's substrate 110 may be removed.

After bonding, one substrate may be removed. FIG. 4 shows, using as example the wafers of FIGS. 2A and 2B, memory structure 30's substrate 110 may be removed. Substrate 110 may be removed by any suitable wafer thinning technique, such as laser lift-off, mechanical polishing, or chemical etch. In one embodiment, mechanical polishing may be combined with chemical etch to remove substrate 110. By combining mechanical polishing with chemical etching, substrate 110 may be removed at a lower cost and with greater precision (i.e. no damage to memory structure 30) than if either technique was used alone. For example, suppose that substrate 110 is 500 micron-thick. Then, mechanical polishing may first remove about 480 microns from substrate in an initial step, thus leaving about 20 microns thick of substrate 110 to be removed by chemical etching.

In wafer-thinning by mechanical polishing, the wafer is rotated about its center against an abrasive surface. Wafer-thinning by mechanical force is sometimes referred to as "grinding," when the resulting substrate surface is rough, and "polishing," when the resulting substrate surface is smooth. Either the grinding or the polishing approach, or any of their combinations, may be used. After completing a mechanical grinding or polishing step, a chemical etch may remove the remaining 20 microns of memory structure 30.

Chemical etch of substrate 110 may be accomplished using any suitable chemistry. Examples of suitable chemical reagents for silicon substrate 110 include KOH, TMAH, $HF^+$, $HNO_3$, or $HF^+$ and $NH_4F$. An oxide layer between silicon substrate 110 and memory structure 30 may server as an etch-stop layer. As shown in FIG. 4, etch-stop layer 120 ensures memory structure 30 remain intact, undamaged from the chemical etching of substrate 110. When the oxide layer (e.g., $SiO_2$) is used as an etch-stop layer, KOH may be used, as it etches silicon about 500 times faster than it etches $SiO_2$. The $SiO_2$ layer therefore acts as an efficient etch-stop for silicon etching.

Figure 5:
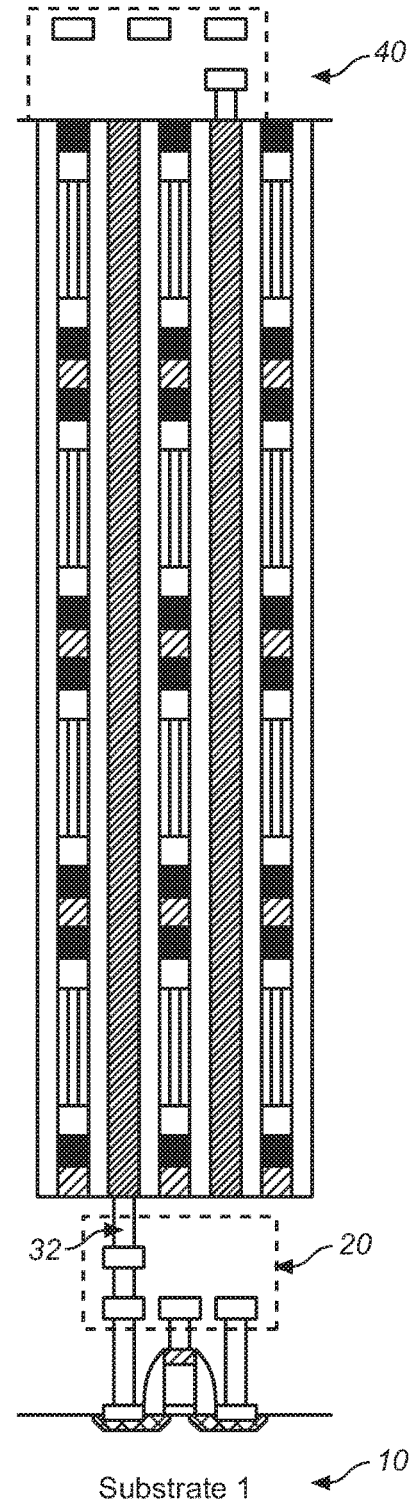
FIG. 5 shows forming interconnect layer 40 memory structure 30.

After substrate 110 is removed, further fabrication can proceed on the bonded wafers. For example, FIG. 5 shows forming interconnect layer 40 memory structure 30. With the formation of memory structure 30 being decoupled from the formation of interconnect layer 40, either aluminum or copper may be selected for interconnect layer 40. Such interconnects may be formed at lower temperatures (e.g., 450° C. or less).

According to another embodiment of the present invention, wafer bonding can be used to fabricate single-crystal transistors beneath a memory array, known as CMOS under the array ("CuA"), and above the memory array, known as CMOS over the array ("CoA"). FIGS. 6A-6F show a sequence of steps by which wafer bonding techniques are used to fabricate both CuA and CoA circuits.

Figure 6C:
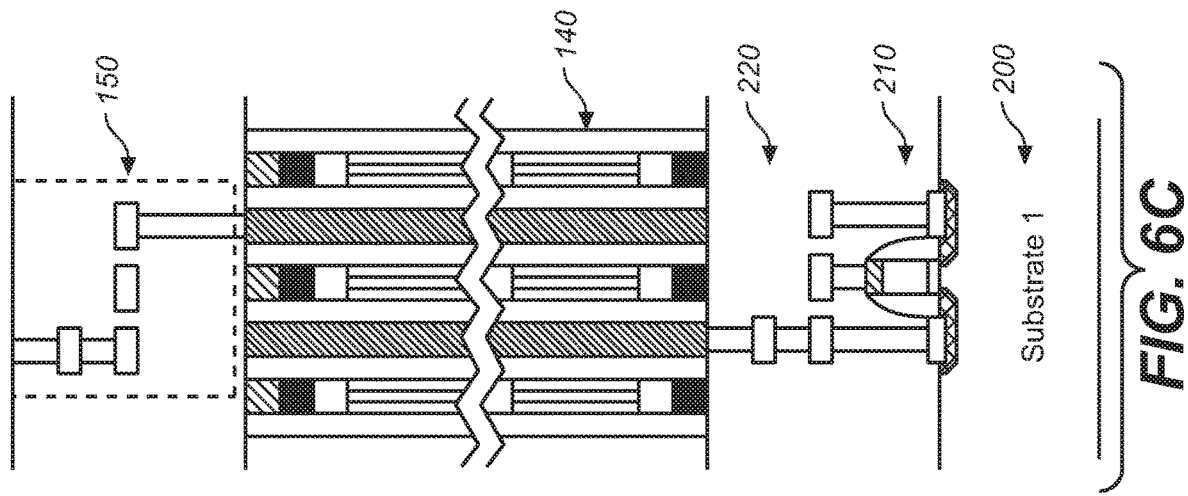
FIGS. 6A, 6B, 6C, 6D, 6E and 6F show a sequence of steps by which wafer bonding techniques are used to fabricate both CuA and CoA circuits.
Figure 6B:
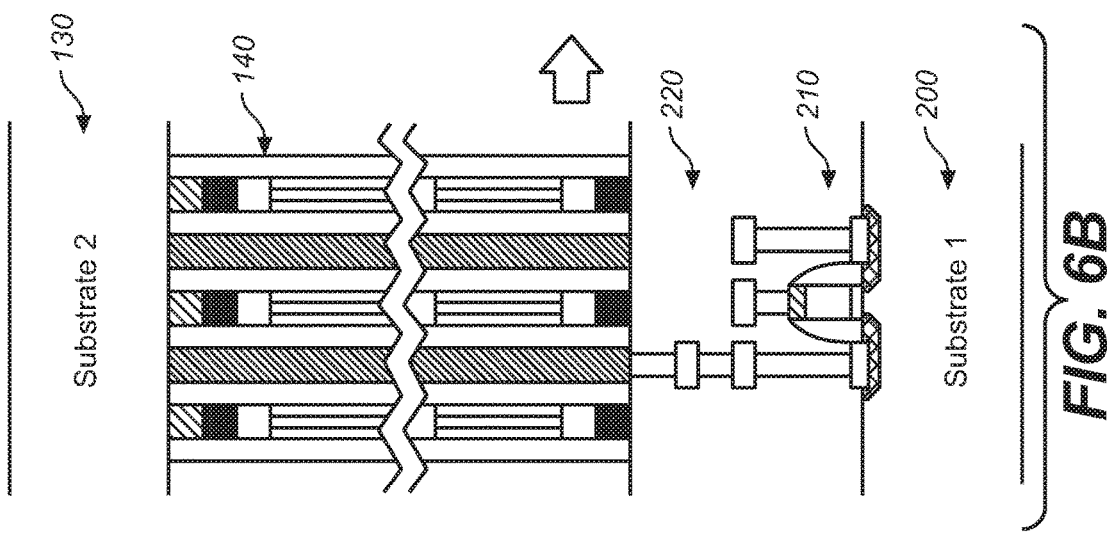
Figure 6A:
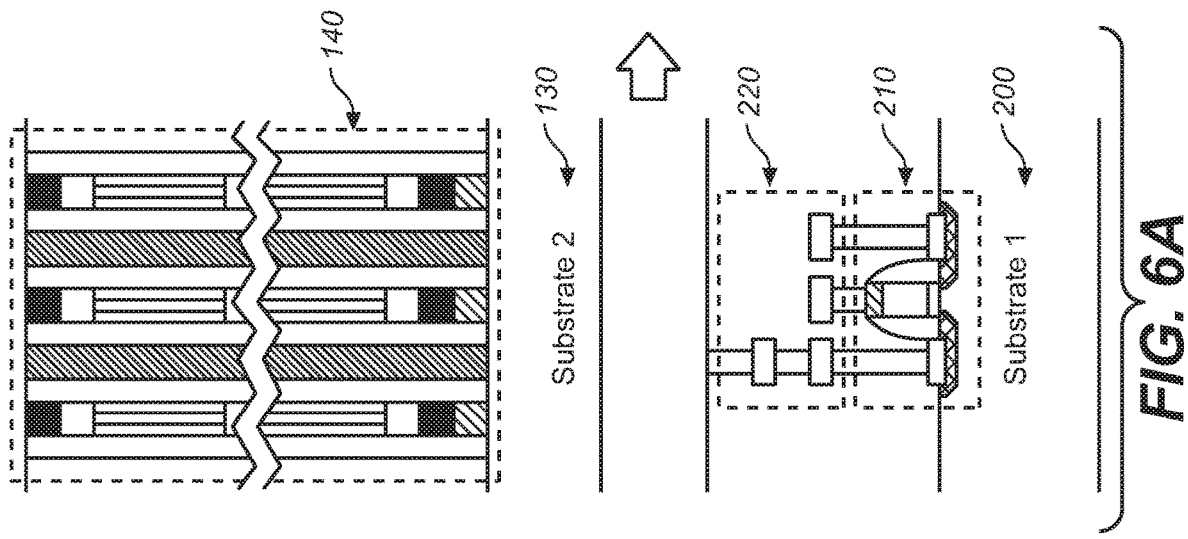

As shown in FIG. 6A, CMOS transistors 210 are fabricated on substrate 200, while memory array 140 is fabricated on substrate 130. Substrate 130 is then flipped over, wafer-bonded to substrate 200, such that memory array 140 is electrically connected with the CMOS transistors 210 on substrate 200 through interconnect layer 220, as shown in FIG. 6B. Substrate 200 is then removed to expose memory array 140. Thereafter, interconnect layer 150 is fabricated from above the exposed side of memory array 140, as shown in FIG. 6C.

Figure 6D:
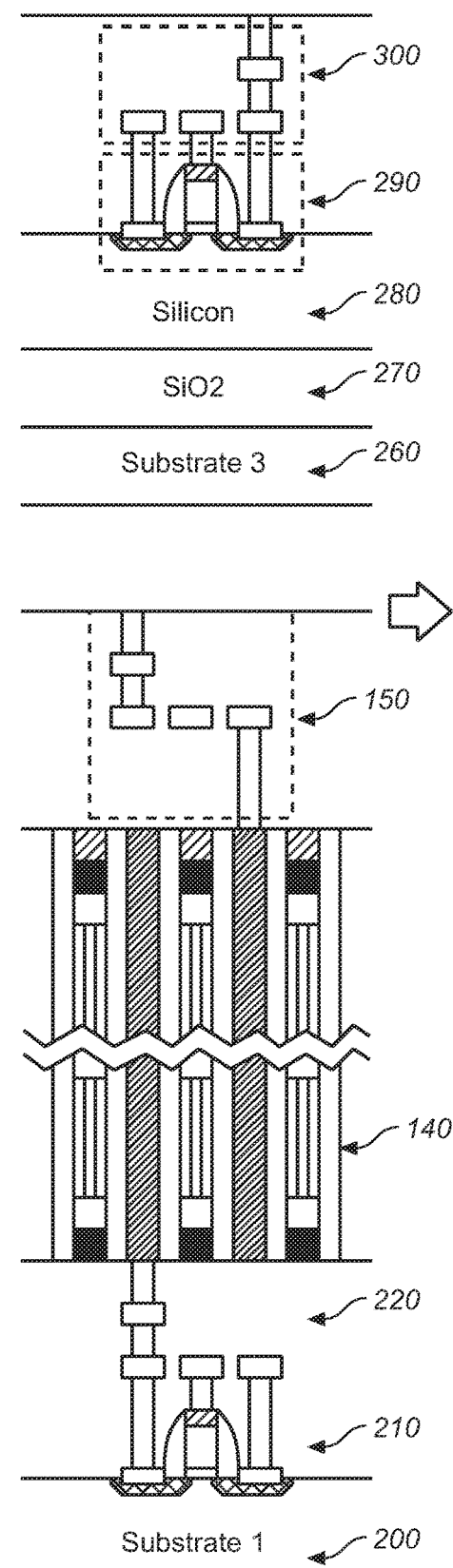
Figure 6E:
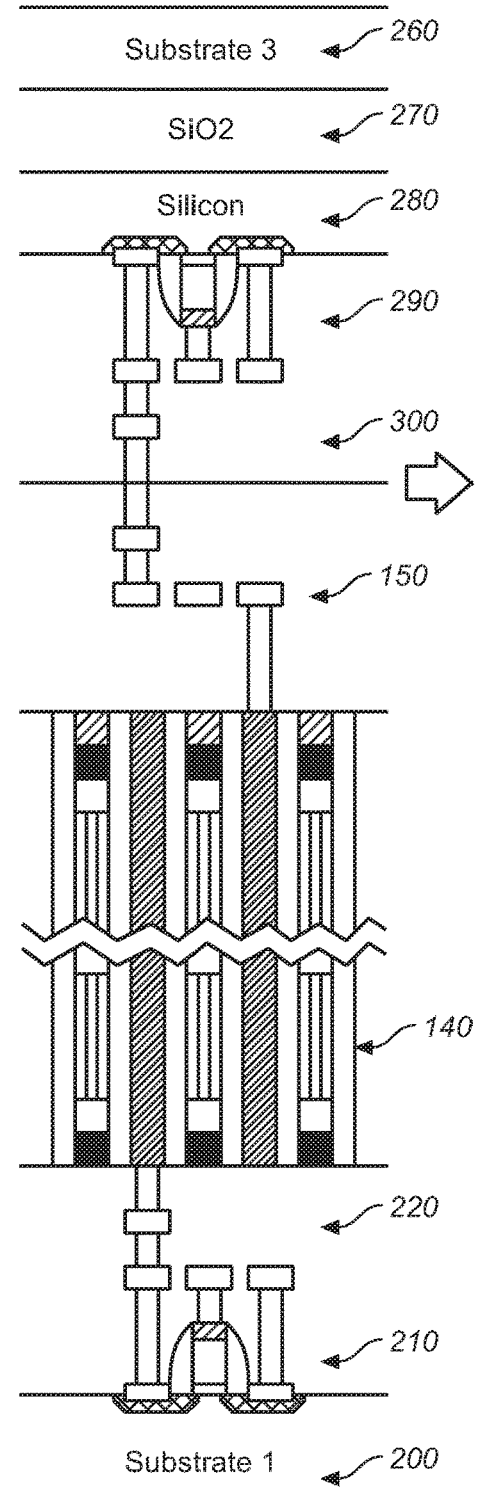

A second group of CMOS transistors 290 is fabricated on substrate 260, as shown in FIG. 6D. Substrate 260 is most preferably silicon-on-insulator ("SOI") wafer, where two layers of single-crystal silicon are provided on opposite sides of an oxide ($SiO_2$) layer. As shown in FIG. 6D, CMOS transistors 290, together with interconnect layer 300 above it, are formed on and above silicon layer 280, which is separated from substrate 260 by $SiO_2$ layer 270. Substrate 260 is then flipped over and wafer-bonded to allow CMOS transistors 290 to electrically connect memory array 140 through interconnect layer 150, as shown in FIG. 6E.

Figure 6F:
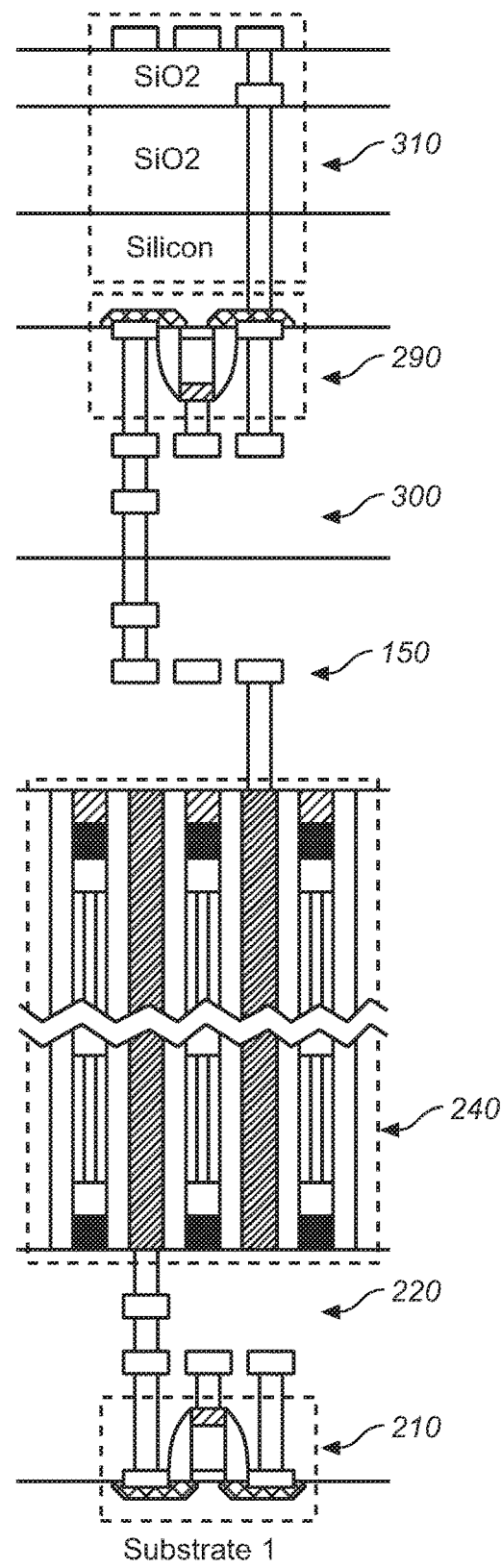

Substrate 260 is then removed to exposed $SiO_2$ layer 270 and interconnect layer 310 is fabricated above and electrically connecting CMOS transistors 290, as shown in FIG. 6F. The resulting combination is CuA-type CMOS transistors 210 built within single-crystal silicon substrate 200, memory array 140 at least partially overlying CMOS transistors 220, CoA-type CMOS transistors 290 at least partially overlying memory array 140, and multiple layers of interconnect layers 150, 200 and 310 overlying and underlying memory array 140. By providing CMOS transistors under and over a memory array, as illustrated in FIGS. 6A-6F, a highly efficient memory array is achieved. A highly efficient memory array refers to a memory array fabricated on a semiconductor die on which substantially all of its area is occupied by memory cells. For example, in FIGS. 6A-6F, CMOS transistors 210 under memory array 140 may be high-voltage or analog transistors, while CMOS transistors 290 over memory array 140 may be low-voltage, short-channel high performance logic CMOS transistors that are desirable at the closest possible physical proximity to the input/output pads of the chip.

Figure 7A:
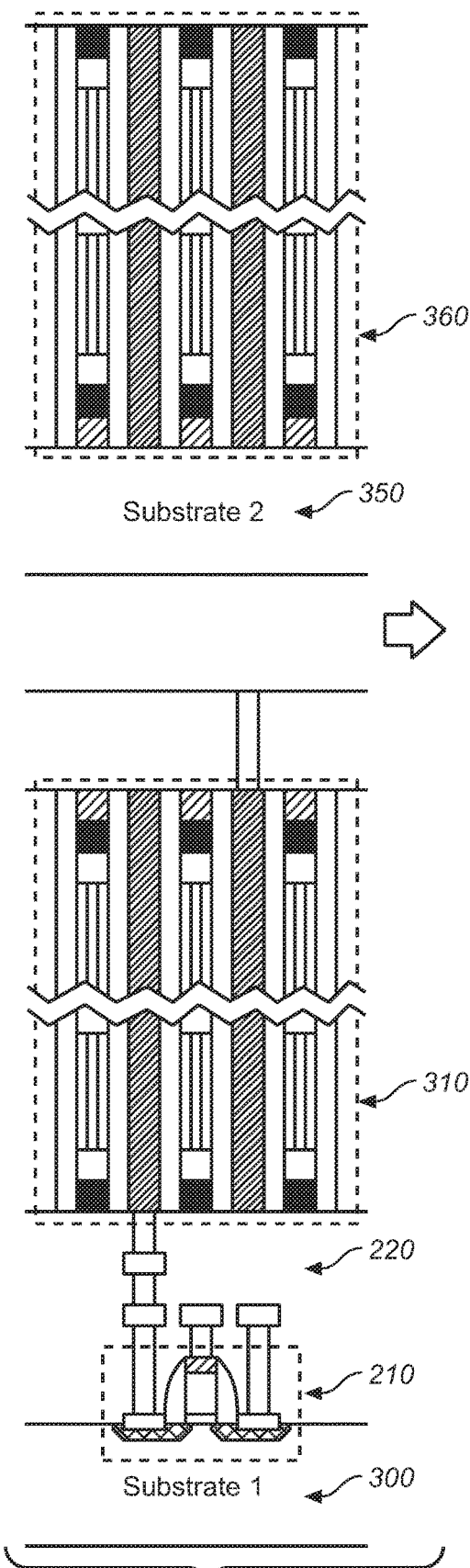
FIGS. 7A, 7B and 7C illustrate joining memory blocks 310 and 360 using wafer bonding of substrates 300 and 350.
Figure 7B:
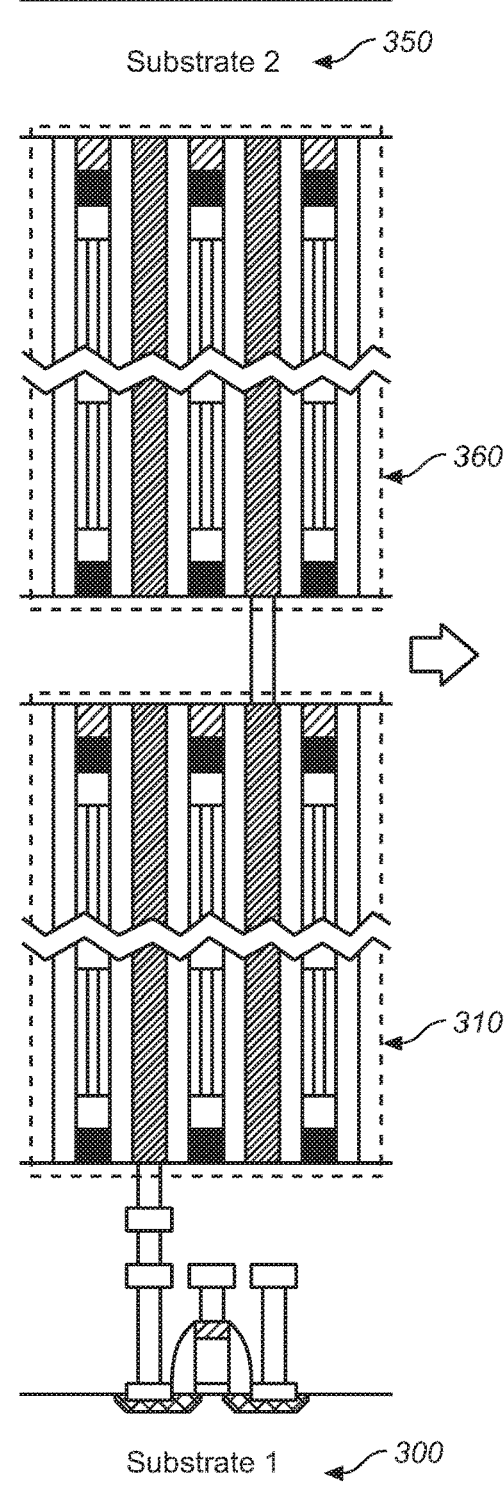
Figure 7C:
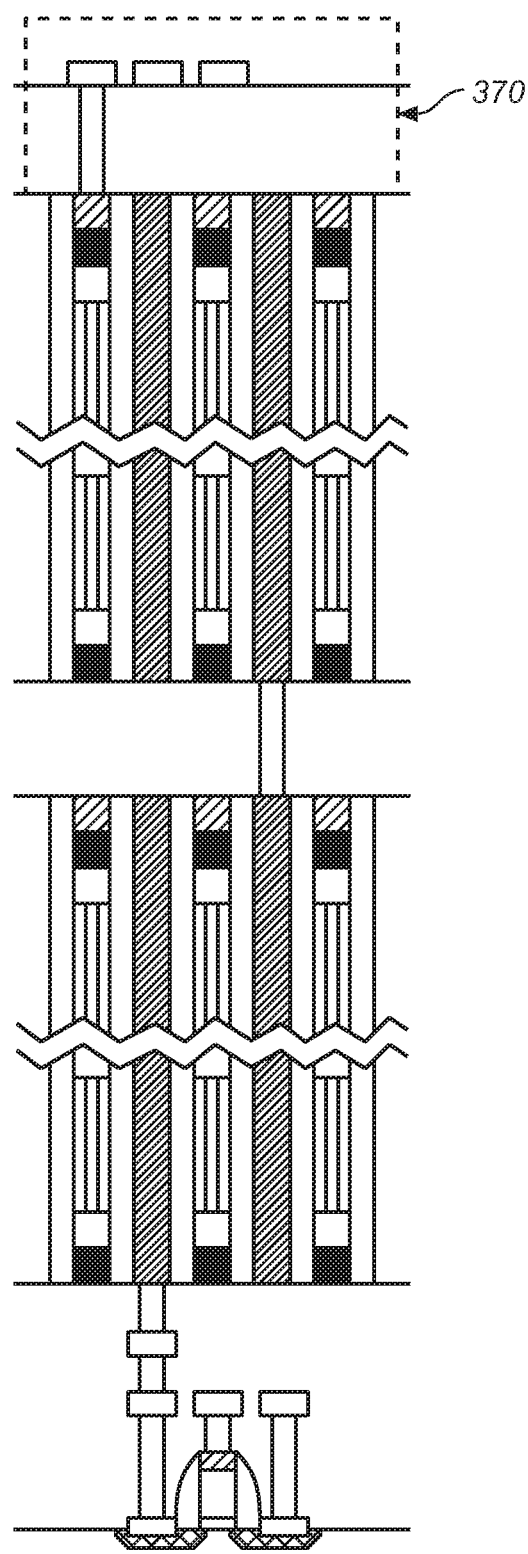

According to yet another embodiment of the present invention, wafer bonding can be used to bond a memory block to another memory block. In this manner, a high-areal density memory structure can be achieved on a single chip, while simplifying fabrication by minimizing the aspect ratio of the memory structure that is fabricated. FIGS. 7A-7C illustrate joining memory blocks 310 and 360 using wafer bonding of substrates 300 and 350. As shown in FIG. 7A, CMOS transistors 210, together with interconnect layer 220, and memory block 310 are fabricated on substrate 300, while memory block 360 is fabricated on substrate 350. Substrate 350 is then flipped over and wafer-bonded with substrate 360, such that memory blocks 310 and 350 are electrically connected, as shown in FIG. 7B. Substrate 350 is then removed and interconnect layer 370 is fabricated, as shown in FIG. 7C.

According to yet another embodiment of the present invention, single-crystal silicon channels for memory cell transistors can be formed by depositing an epitaxial silicon layer that indexes off a single-crystal substrate. Such a process is difficult for a memory block with CuA-type CMOS transistors, as a "clear" path from substrate to the source/drain layers of the memory array may not be available. Examples of forming single-crystal epitaxial silicon in thin-film storage transistors are disclosed, for example, in Provisional Application II incorporated by reference above. In particular, Provisional Application II discloses, among other types of thin-film storage transistors, one type of thin-film storage transistors—referred herein as "quasi-volatile memory (QVM) circuits"—that has a data retention time (e.g., 100 milliseconds to one year) that is greater than that of conventional dynamic random-access memory (DRAM) circuits and less than that of conventional non-volatile memory circuits. The QVM circuits may be organized, for example, as 3-dimensional arrays of NOR memory strings. When only the memory block is built on top of a silicon substrate (i.e., without the CuA-type CMOS transistors beneath it), a clear path is provided for epitaxial silicon deposition. The substrate with the resulting memory block can then be wafer-bonded to another substrate on which with CMOS transistors have been fabricated. FIGS. 8A-8E illustrate a process by which CuA-type CMOS transistors are provided underneath a memory block with epitaxial single-crystal silicon channels in the memory cells, according to one embodiment of the present invention.

Figure 8A:
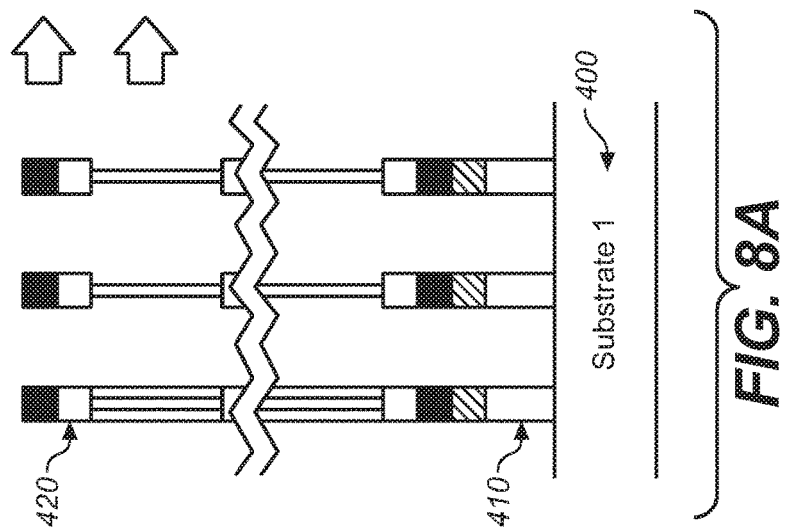
FIGS. 8A. 8B, 8C, 8D, and 8E illustrate a process by which CuA-type CMOS transistors are provided underneath a memory block with epitaxial single-crystal silicon channels in the memory cells, according to one embodiment of the present invention.
Figure 8B:
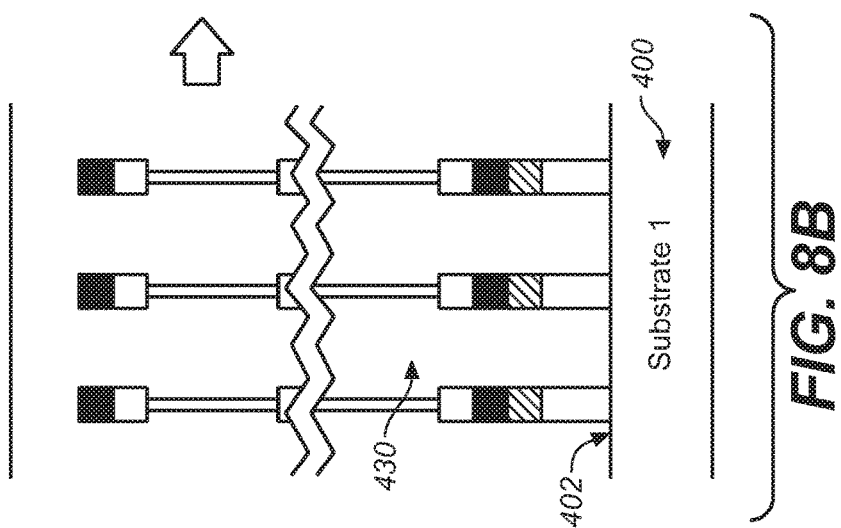
Figure 8C:
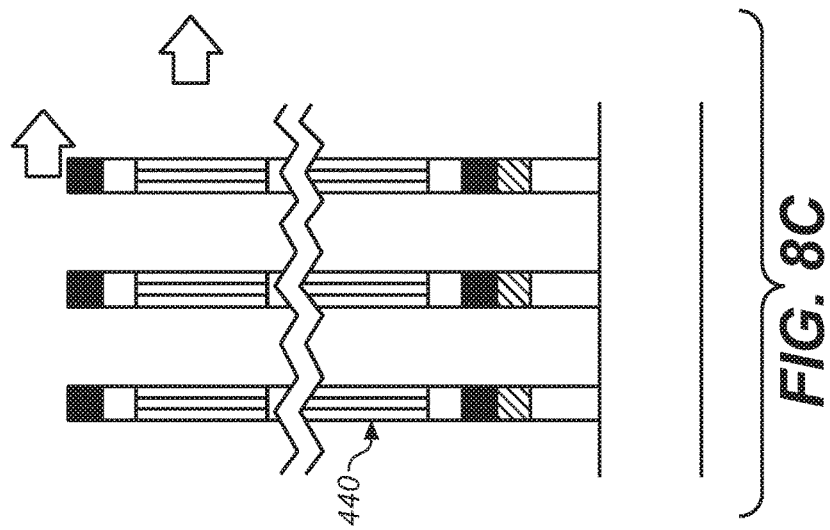
Figure 8D:
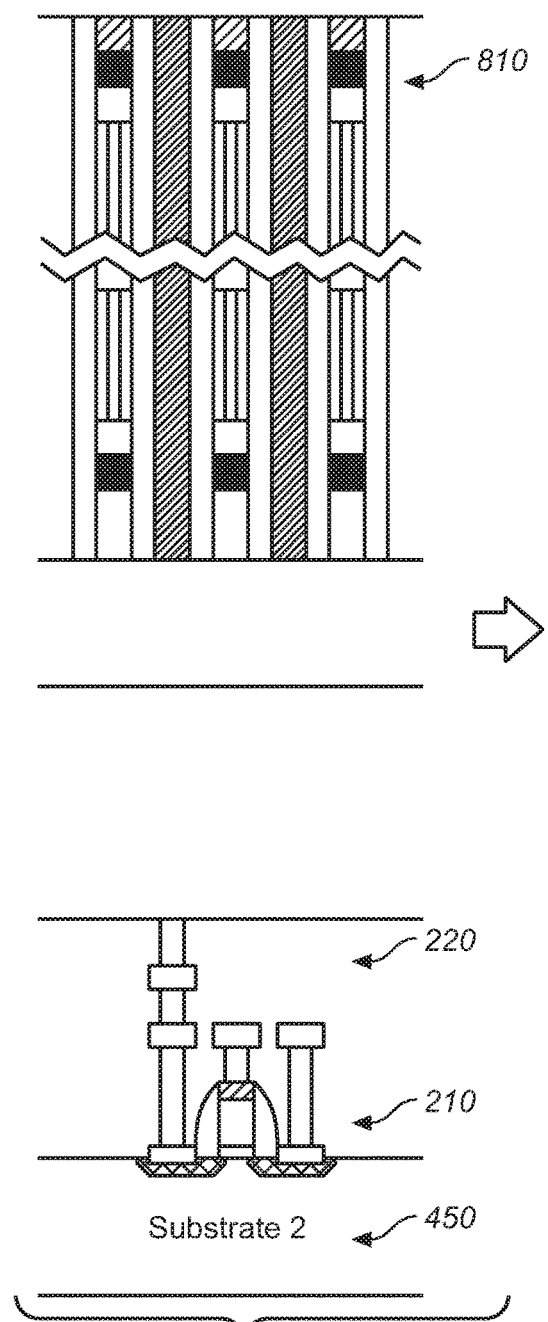
Figure 8E:
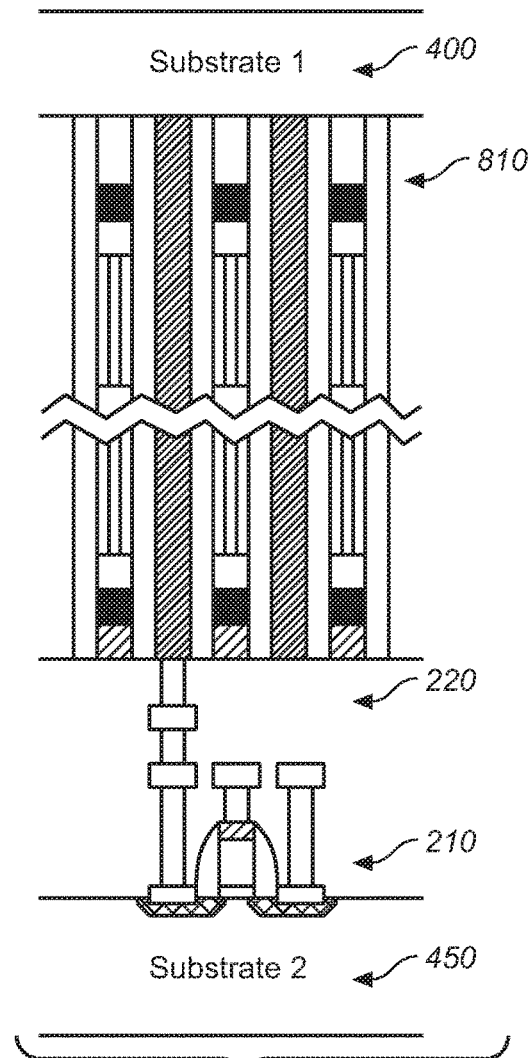

As shown in FIG. 8A, stacks of active strips—each active strip having source and drain layers 420—are first formed on substrate 400, with trenches separating adjacent stacks of active strips reaching down to substrate 400, as shown in FIG. 8A. Epitaxial silicon 430 that indexes off the silicon substrate 400 are then grown from surface 402 of substrate 400, as shown in FIG. 8B. An anisotropic etch then substantially removes all of epitaxial silicon 430 from the trenches, except for epitaxial silicon channels 440 left in the recessed area between the source and drain layers of the active strips, as shown in FIG. 8C. Memory block 810 fabrication then proceeds to completion, as shown in FIG. 8D. (Exemplary fabrication processes are disclosed, for example, in the Copending Application incorporated by reference above.) Substrate 400 is then flipped over and wafer-bonded to substrate 450, which contains CMOS transistors 210 and interconnect layer 220 formed thereon, as shown in FIGS. 8D-8E. Substrate 400 can be removed, and interconnect layers may be fabricated above the memory block as has been previously described.

The above detailed description is provided to illustrate specific embodiments of the present invention and is not intended to be limiting. Numerous variations and modifications within the scope of the present invention are possible. The present invention is set forth in the accompanying claims.

We claim:

1. An integrated circuit, comprising:
a monocrystalline semiconductor substrate;
a first set of circuitry comprising single-crystal transistors formed in the semiconductor substrate;
a first interconnect layer comprising a plurality of conductors that are formed on top of the circuitry;
a first memory block electrically connected to the first set of circuitry through the conductors in the first interconnect layer, wherein the conductors in the first interconnect layer and the first memory block are joined by wafer-bonding;
a second interconnect layer formed above the first memory block, wherein the second interconnect layer includes a plurality of conductors and wherein the first and second interconnect layers are provided on opposite sides of the first memory block;
a second set of circuitry, formed in a silicon layer that is provided on an insulator layer of a silicon-on-insulator wafer, wherein the second set of circuitry comprises single-crystal transistors, wherein the second set of circuitry is electrically connected to the first memory block through the conductors in the second interconnect layer, and wherein the second set of circuitry and the conductors in the second interconnect layer are joined by wafer bonding; and
a third interconnect layer, wherein the third interconnect layer comprises a plurality of conductors and is provided on a side of the insulator layer opposite the silicon layer on which the second set of circuitry is formed.

2. The integrated circuit of claim 1, wherein the wafer-bonding is one of: thermocompression, adhesive, anodic, and thermal wafer bonding.

3. The integrated circuit of claim 1, wherein the second set of circuitry is formed in a silicon layer that is provided on an insulator layer of a silicon-on-insulator wafer.

4. The integrated circuit of claim 1, wherein the first set of circuitry comprises high-voltage or analog transistors.

5. The integrated circuit as in claim 1, wherein the second set of circuitry is formed out of low-voltage, short-channel high performance logic CMOS transistors.

6. The integrated circuit of claim 1, further comprising a second memory block, wherein the second memory block is electrically connected to the first memory block through the conductors in the second interconnect layer, and wherein the second memory block and the conductors in the second interconnect layer are joined by wafer bonding.

7. The integrated circuit of claim 1, wherein the first memory block comprises memory cells having single-crystal silicon channel material.

8. The integrated circuit of claim 1, further comprising a second memory block, wherein the second memory block is electrically connected to the first memory block and wherein the first memory block and the second memory block are joined by wafer bonding.

9. The integrated circuit of claim 1, wherein the first memory block comprises one or more of: a non-volatile memory string array and a quasi-volatile memory string array.

10. The integrated circuit of claim 9, wherein the first memory block is organized as 3-dimensional memory arrays.

11. The integrated circuit of claim 10, wherein the 3-dimensional memory arrays comprise NOR-type memory strings.

* * * * *